(12) United States Patent
Kim et al.

(10) Patent No.: US 10,563,775 B2
(45) Date of Patent: Feb. 18, 2020

(54) VACUUM VALVE

(71) Applicant: PRESYS.CO., LTD, Suwon-si (KR)

(72) Inventors: Bae-Jin Kim, Suwon-si (KR); Sang Min Kim, Suwon-si (KR); Ki Sun Choi, Hwaseong-si (KR); Kang Hyun Kim, Hwaseong-si (KR)

(73) Assignee: PRESYS.CO., LTD, Suwon (KR)

( * ) Notice: Subject to any disclaimer, the term of this patent is extended or adjusted under 35 U.S.C. 154(b) by 185 days.

(21) Appl. No.: 15/571,713

(22) PCT Filed: Apr. 14, 2016

(86) PCT No.: PCT/KR2016/003883
§ 371 (c)(1),
(2) Date: Nov. 25, 2017

(87) PCT Pub. No.: WO2016/178480
PCT Pub. Date: Nov. 10, 2016

(65) Prior Publication Data
US 2018/0156340 A1    Jun. 7, 2018

(30) Foreign Application Priority Data
May 4, 2015    (KR) ........................ 10-2015-0062477

(51) Int. Cl.
*F16K 3/18*    (2006.01)
*F16K 3/02*    (2006.01)
(Continued)

(52) U.S. Cl.
CPC ................ *F16K 3/184* (2013.01); *F16K 3/02* (2013.01); *F16K 3/0218* (2013.01);
(Continued)

(58) Field of Classification Search
CPC ........ F16K 3/184; F16K 3/0254; F16K 51/02; F16K 3/0218; F16K 3/18; F16K 3/02; H01L 21/67126
See application file for complete search history.

(56) References Cited

U.S. PATENT DOCUMENTS 6,237,892 B1 *    5/2001    Ito ........................... F16K 3/184
                                                                        251/193
6,431,518 B1 *    8/2002    Geiser .................... F16K 51/02
                                                                        251/158

(Continued)

FOREIGN PATENT DOCUMENTS

CN          103307290 A      9/2013
JP             3033529 U      1/1997
(Continued)

*Primary Examiner* — Marina A Tietjen
(74) *Attorney, Agent, or Firm* — Patentfile, LLC; Bradley C. Fach; Steven R. Kick

(57) ABSTRACT

The present invention relates to a vacuum valve, and more particularly, to a vacuum valve including a valve housing with a blade, a main shaft, a vertical moving part, a horizontal moving part, a horizontal moving unit, and a main body bracket. Opening and closing guide holes are obliquely formed in both side surfaces such that cam rollers, having passed through the vertical moving guide grooves, are inserted into the grooves so as to guide the fore and aft movement of the blade according to the vertical movement of the horizontal moving unit.

5 Claims, 8 Drawing Sheets

(51) Int. Cl.
*F16K 51/02* (2006.01)
*H01L 21/67* (2006.01)

(52) U.S. Cl.
CPC ............ *F16K 3/0254* (2013.01); *F16K 3/18* (2013.01); *F16K 51/02* (2013.01); *H01L 21/67126* (2013.01)

(56) References Cited

U.S. PATENT DOCUMENTS

| | | | |
|---|---|---|---|
| 6,629,682 B2* | 10/2003 | Duelli | F16K 3/18 251/158 |
| 8,177,190 B2* | 5/2012 | Maerk | F16K 3/0218 251/158 |
| 8,672,293 B2* | 3/2014 | Ehrne | F16K 3/182 251/158 |
| 8,800,956 B2* | 8/2014 | Ishigaki | F16K 3/16 251/203 |
| 2012/0258242 A1* | 10/2012 | Tsunoda | C23C 14/34 427/131 |

FOREIGN PATENT DOCUMENTS

| | | |
|---|---|---|
| JP | 2002323149 A | 11/2002 |
| KR | 100390030 B1 | 7/2003 |
| KR | 100596332 B1 | 7/2006 |
| KR | 101376045 B1 | 3/2014 |

\* cited by examiner

VACUUM VALVE

This Application is a 35 U.S.C. 371 National Stage Entry of International Application No. PCT/KR2016/003883 on Apr. 14, 2016, which claims the benefit of Republic of Korea Patent Application No. 10-2015-0062477, filed on May 4, 2015, the entire disclosures of which are incorporated by reference herein.

TECHNICAL FIELD

The present invention relates to a vacuum valve, and more particularly, to a vacuum valve 1 characterized by including: a valve housing 100 having a driving space 110 formed therein and moving passage parts 120 and 120' formed to pass through both side surfaces thereof; a blade 200 provided in the driving space 110 and opening/closing the moving passage parts 120 and 120' from inside the valve housing 100; a main shaft 300 coupled to a rear surface of the blade 200; a vertical moving part 400 which is formed under the valve housing 100, and in which the main shaft 300 and a first piston 410, which moves vertically by pneumatic pressure, are connected to vertically move the blade 200; a horizontal moving part 500 coupled to the lower portion of the vertical moving part 400 and provided with vertical movement guide grooves 510 and 510' formed vertically in both side surfaces thereof; a horizontal moving unit 600 having a second piston 610 provided to an inside 501 of the horizontal moving part 500 and vertically moved by pneumatic pressure, a movement guide block 620 formed under the second piston 610, and cam rollers 630 and 630' formed at both sides of the movement guide block 620 and passing through the vertical moving guide grooves 510 and 510'; and a main body bracket 700 provided under the valve housing 100 so as to accommodate the vertical moving part 400 and the horizontal moving part 500, wherein opening/closing guide holes 710 and 710' are obliquely formed in both side surfaces such that the cam rollers 630 and 630', having passed through the vertical moving guide grooves 510 and 510', are inserted into the grooves 710 and 710' so as to guide the fore and aft movement of the blade 200 according to the vertical movement of the horizontal moving unit 600.

BACKGROUND ART

In general, semiconductor manufacturing processes for manufacturing semiconductor devices require high precision, and thus, high cleanliness and special production technology have been demanded.

For this reason, semiconductor devices are manufactured in a state in which foreign substances contained in air are completely prevented from contacting the devices, that is, in a vacuum state, and thus, products with high reliability and completeness may be manufactured.

Meanwhile, in order to maintain a vacuum state inside a process chamber for manufacturing semiconductor devices, a vacuum pump for suctioning air and other gases in the process chamber is installed outside the process chamber.

In addition, a vacuum valve is installed between the process chamber and the vacuum pump. When the air and other gases in the process chamber are discharged to the outside, the vacuum valve is opened, and when the vacuum state in the process chamber is maintained, the vacuum valve is closed. Thus, the inside of the process chamber may always be maintained at a clean vacuum state.

Among such vacuum valves, the "mount-type rectangular gate valve" disclosed in patent document 1 (Korean Patent Application Laid-open Publication No. 10-2003-0050409) is a rectangular gate valve including: an air cylinder which vertically moves a shaft while maintaining vacuum using O-rings; a rectangular disk, and a main body provided with a rectangular passage thereon. This valve had merits in that the disk and the passage had a high sealing effect and the disk could be easily manufactured, because the valve was provided with: a rectangular opening/closing disk including four mounting rolls which were hingedly connected to the shaft of the cylinder and respectively provided on four edge portions; side rolling rolls rolling on left and right side surfaces, and a rectangular O-ring having sides around the front surface of the disk, four mounting balls disposed on rear inner surfaces of the rectangular gate valve main body and having a lifting angle corresponding to the mounting rolls; and ball plungers protruding from inside of the front surface of the main body and configured such that three ball plungers were respectively provided to be biased to left and right sides; and the disk, the side rolling rolls, and the ball plungers were configured to apply force always in the direction in which the rectangular opening/closing disk moved away from the front surface of the main body, and configured such that the rectangular opening/closing disk was vertically moved by the vertical movement of the shaft, and as the mounting rolls moved upward along the mounting balls, the rectangular opening/closing disk provided with the O-ring came into close contact with the passage of the front surface and provides perfect sealing.

However, the "mount-type rectangular gate valve disclosed in patent document 1 was provided with, in a subject moving space, the four mounting rolls, side rolling rolls, and the rectangular opening/closing disk provided with the O-ring, and thus had a limitation in that when the rectangular opening/closing disk continuously operates, wear of the mounting rolls, side rolling rolls, and the O-ring occurred and thereby caused air leak and particles generated in the subject moving space.

In addition, there was a limitation in that since, in the above-mentioned structure configured such that when the rectangular opening/closing disk moved upward by an air cylinder, the mounting rolls moved upward riding on tilted mounting balls and the rectangular opening/closing disk closed the passage, the rectangular opening/closing disk was vertically moved by pneumatic pressure generated from an air cylinder without a separate configuration, so that if aid leaks in the air cylinder, the rectangular opening/closing disk was arbitrarily opened and thus could not normally operate.

DISCLOSURE OF THE INVENTION

Technical Problem

The present invention addresses the above-mentioned limitations and the purpose of the present invention is to provide a vacuum valve which may minimize the concern that particles generated due to mechanical wear caused by a vertical movement of a blade by being provided with only a blade having a simple structure for opening/closing a moving passage part without a separate configuration.

In addition, another purpose of the present invention is to provide a vacuum valve which may have less space restriction by providing a vertical moving part and a horizontal moving part, which function as cylinders so as to be accommodated in a main body bracket and thereby manufactured in a compact type.

Another purpose of the present invention is to provide a vacuum valve in which: the moving passage part may be opened/closed by a simple operation by moving the blade in the fore and aft direction using cam rollers and opening/closing guide grooves; and the blade may be prevented from being arbitrarily operated by the opening/closing guide holes using inclinations.

Technical Solution

To solve the above-mentioned limitations, a vacuum valve in accordance with an embodiment of the present invention includes: a valve housing (100) having a driving space (110) formed therein and moving passage parts (120) and (120') formed to pass through both side surfaces thereof; a blade (200) provided in the driving space (110) and opening/closing the moving passage parts (120 and 120') from inside the valve housing (100); a main shaft (300) coupled to a rear surface of the blade (200); a vertical moving part (400) which is formed under the valve housing (100), and in which the main shaft (300) and a first piston (410), which moves vertically by pneumatic pressure, are connected to vertically move the blade (200); a horizontal moving part (500) coupled to a lower portion of the vertical moving part (400) and provided with vertical movement guide grooves (510 and 510') formed vertically in both side surfaces thereof; a horizontal moving unit (600) having a second piston (610) provided to an inside (501) of the horizontal moving part (500) and vertically moved by pneumatic pressure, a moving guide block (620) formed under the second piston (610), and cam rollers (630 and 630') formed at both sides of the moving guide block (620) and passing through the vertical moving guide grooves (510 and 510'); and a main body bracket (700) provided under the valve housing (100) so as to accommodate the vertical moving part (400) and the horizontal moving part (500), wherein opening/closing guide holes (710) and (710') are obliquely formed in both side surfaces of the bracket (700) such that the cam rollers (630 and 630'), having passed through the vertical moving guide grooves (510) and (510'), are inserted into the grooves (710 and 710') so as to guide the fore and aft movement of the blade (200) according to the vertical movement of the horizontal moving unit (600).

In addition, the opening/closing guide holes (710) and (710') may be provided such that: closing hole intervals (710b and 710b') may be provided in a lower portion thereof to be recessed toward a rear surface of the valve housing (100), and opening hole intervals (710a and 710a') may be provided in an upper portion thereof to be recessed toward a front surface of the valve housing (100).

In addition, in border surfaces between the closing hole intervals (710b and 710b') and the opening hole intervals (710a and 710a'), deviation preventing protrusions (711 and 711') may be provided to protrude, so that the cam rollers (630 and 630') may be prevented from being arbitrarily deviated from the opening hole intervals (710a and 710a') while being located in the opening hole intervals (710a and 710a').

In addition, insertion grooves (720 and 720') may be provided to be recessed in both inner side surfaces of the main body bracket (700) and rotating roller parts (420) and (420') may be respectively provided in both outer side surfaces of the vertical moving part 400 so as to be inserted in the insertion grooves (720 and 720') and to enable the pivotal rotation of the vertical moving part (400) around the insertion grooves (720 and 720').

In addition, guide shafts (310 and 310') which guide a vertical movement of the blade (200) may be formed on the rear surface of the blade (200) to be symmetrical to each other; guide grooves (621 and 621') may be vertically formed to be symmetrical to each other in the movement guide block (620); and fixed shaft members (740 and 740') which are respectively inserted into the guide grooves (621) and (621') to guide a vertical movement of the horizontal moving unit (600) may be provided to protrude in a lower inner portion of the horizontal moving part (500).

Advantageous Effects

As described so far, the present invention has a merit of minimizing the concern that particles generated due to mechanical wear caused by a vertical movement of a blade by being provided with only a blade having a simple structure for opening/closing a moving passage part without a separate configuration.

In addition, the present invention has a merit of having less space restriction by providing a vertical moving part and a horizontal moving part, which function as cylinders so as to be accommodated in a main body bracket and thereby manufactured in a compact type.

In addition, the present invention has a merit of being capable of opening/closing the moving passage part by a simple operation by moving the blade in the fore and aft direction using cam rollers and opening/closing guide grooves; and preventing the blade from being arbitrarily operated by the opening/closing guide holes using inclinations.

MODE FOR CARRYING OUT THE INVENTION

Figure 1:
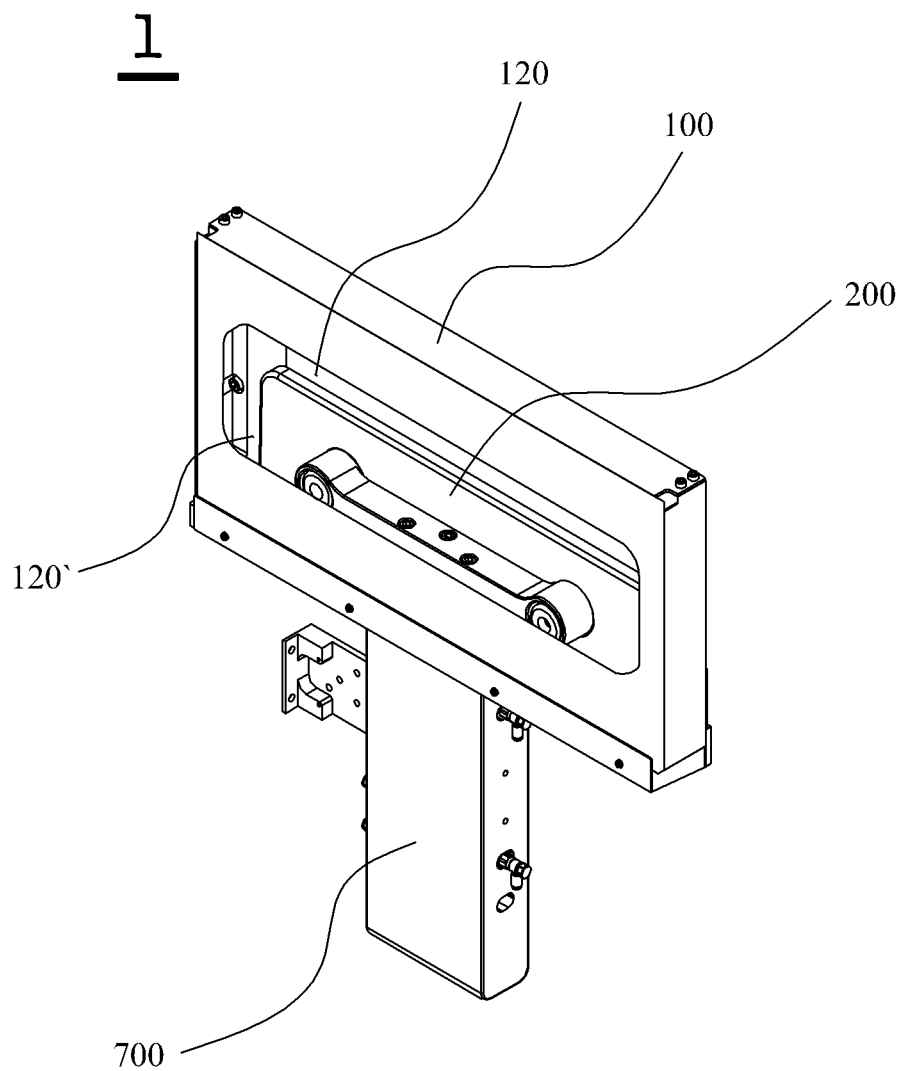
FIG. 1 is a perspective view illustrating an overall configuration of a vacuum valve in accordance with a preferred exemplary embodiment of the present invention.

Hereinafter with reference to accompanying drawings, a vacuum valve in accordance with an exemplary embodiment of the present invention will be described in detail. First, it should be noted that in the drawings, like components or parts are represented by like reference numerals, if possible. In describing the present invention, when a detailed description about a related well-known function or configuration may obscure the gist of the present invention, the detailed description thereof will not be provided.

A vacuum valve 1 in accordance with an exemplary embodiment of the present invention roughly includes a valve housing 100, a blade 200, a main shaft 300, a vertical moving part 400, a horizontal moving part 500, a horizontal moving unit 600 and a main body bracket 700.

Figure 6:
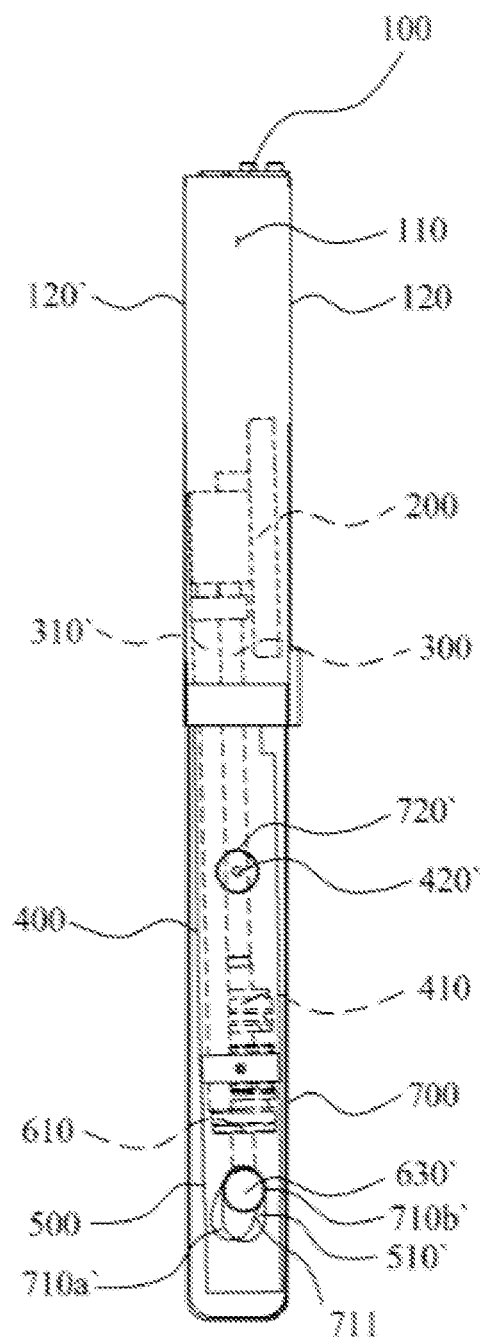
FIG. 6 is a view illustrating a state of a vacuum valve before operation in accordance with a preferred exemplary embodiment of the present invention.
Figure 7:
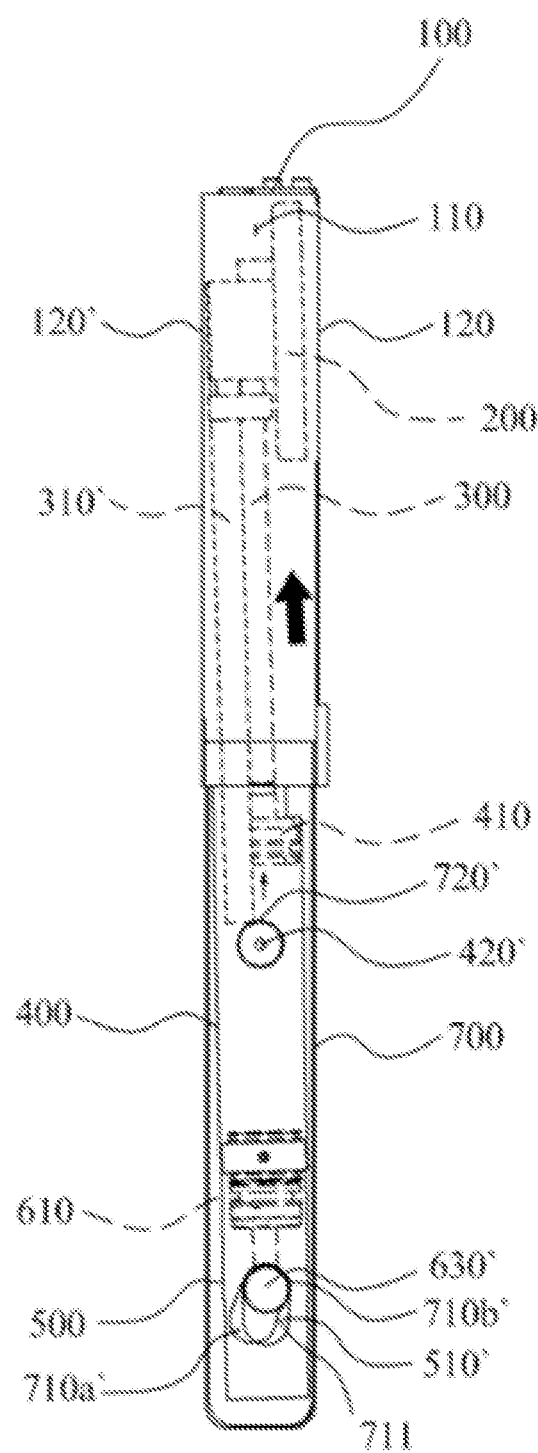
FIG. 7 is an operation state view illustrating a state in which a main shaft and guide shafts move upward due to an operation of the vertical moving part in the configuration of a vacuum valve in accordance with a preferred exemplary embodiment of the present invention.

Before moving to description, it should be noted that with respect to FIG. 6, the right side is set as a closing direction, and the left side is set as opening direction.

In addition, it should be noted that a subject described in the present invention is a substance or an object including a semiconductor device, a wafer, a fluid, etc.

Figure 2:
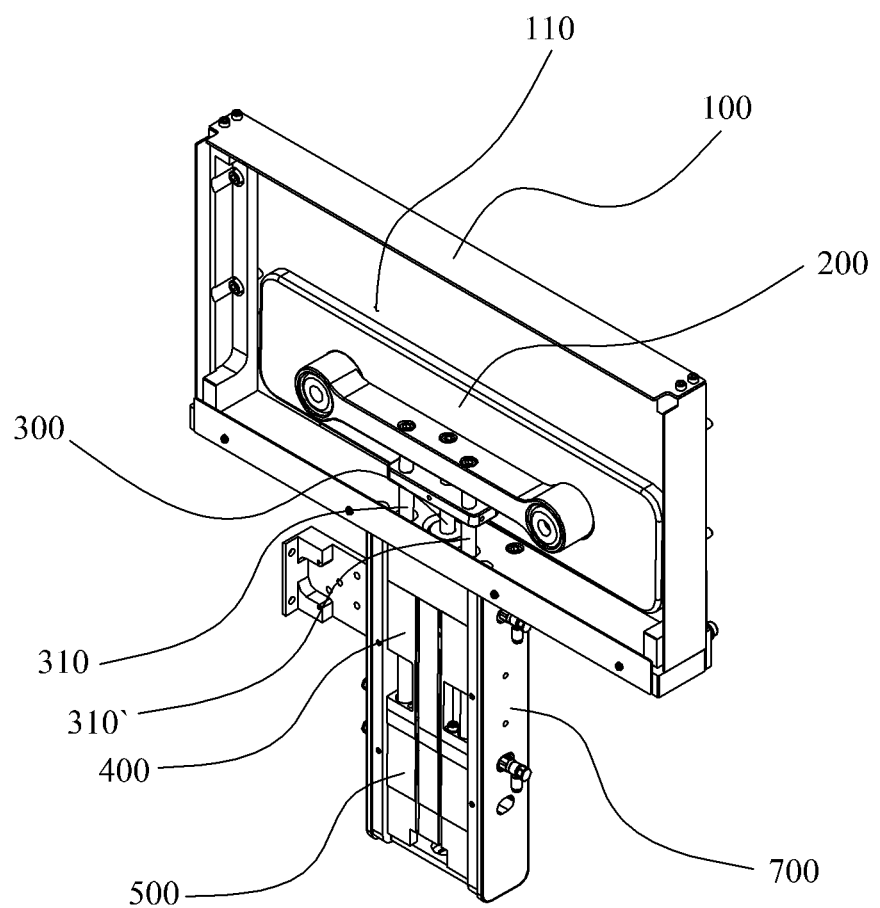
FIG. 2 is a perspective view illustrating an inner configuration of a valve housing and a main body bracket in accordance with a preferred exemplary embodiment of the present invention.

First, the valve housing 100 will be described. As illustrated in FIG. 1 or 2, the valve housing 100 is the component, in which moving passages 120 and 120', through which a subject is moved, are formed as an opening in both side surfaces thereof, and has, on the inner side thereof, a driving space 110 formed as a space without a separate configuration so as to be provided with a valve blade 200 to be described later.

Meanwhile, a plurality of shaft insertion holes (not shown) are formed on a lower portion of the valve housing 100, so that a main shaft 300 and a guide shafts 310 and 310', which will be described later and connected to a vertical moving part 400 to be described later, may be coupled to the valve blade 200 provided in the driving space 110.

Figure 3:
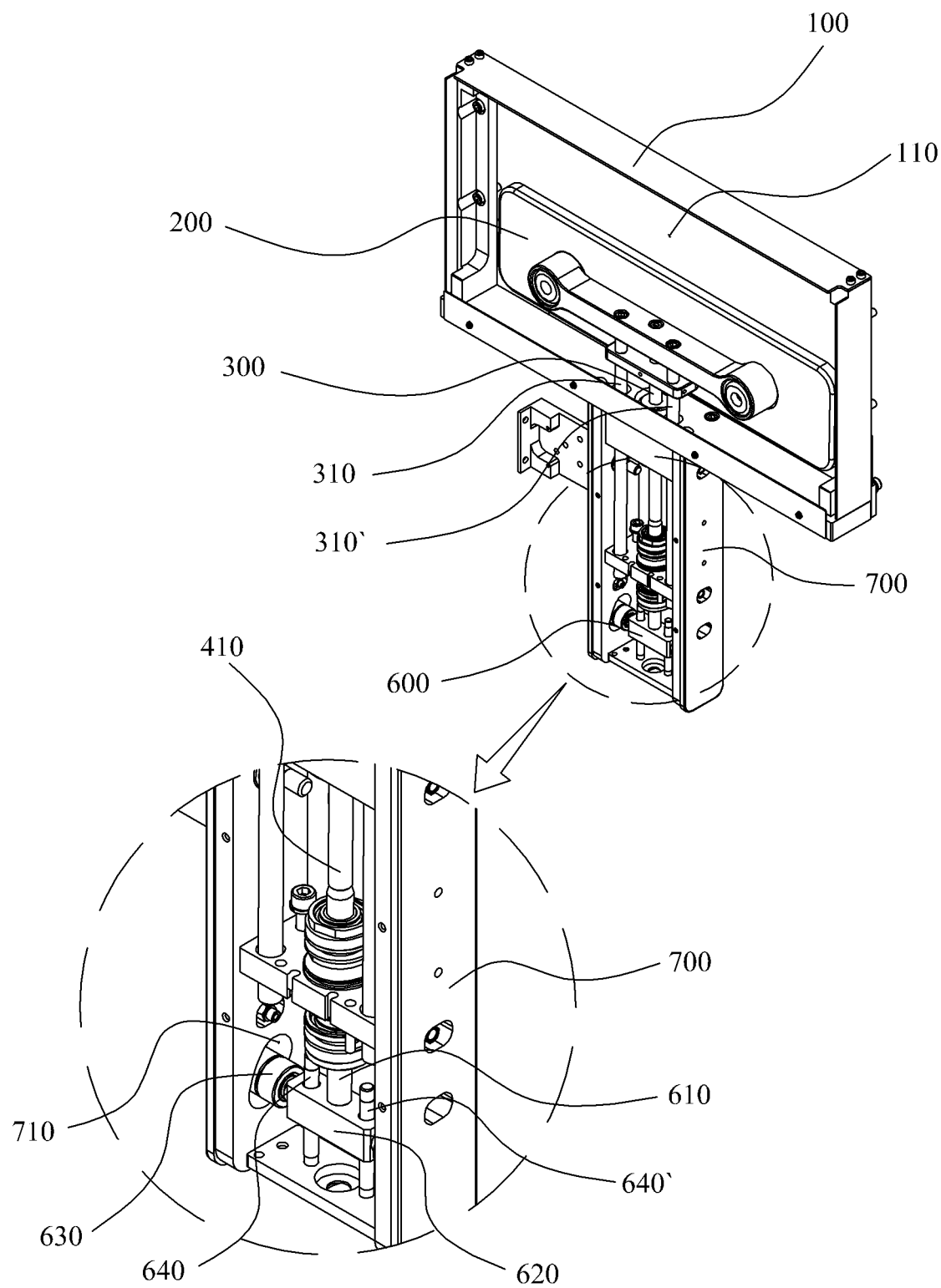
FIG. 3 is a perspective view illustrating an inner configuration of vertical and horizontal moving parts of a vacuum valve in accordance with a preferred exemplary embodiment of the present invention.
Figure 4:
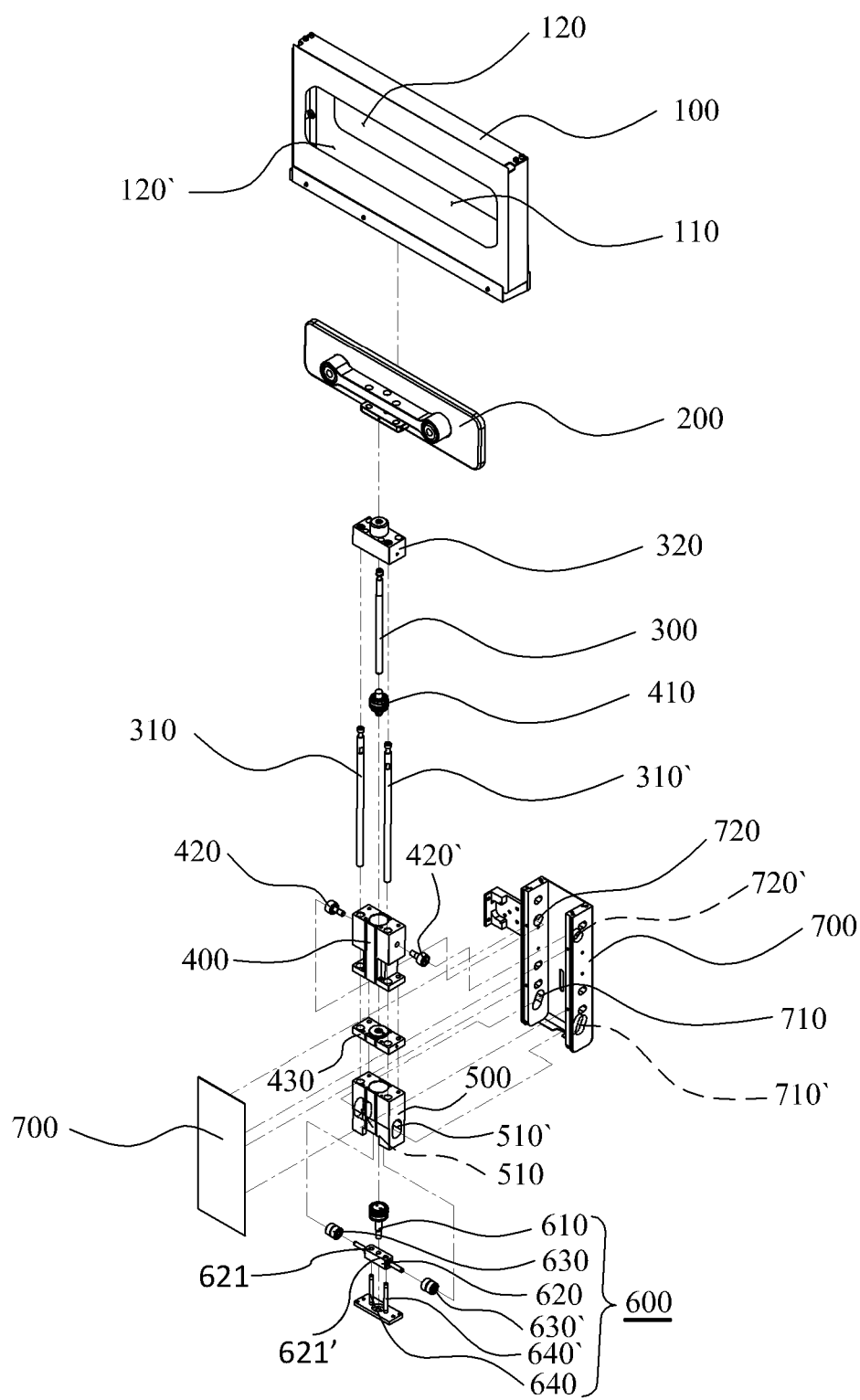
FIG. 4 is an exploded perspective view illustrating a disassembled state of a vacuum valve in accordance with a preferred exemplary embodiment of the present invention.

Next, the blade 200 will be described. As illustrated in FIG. 3 or 4, the blade 200 is installed in the driving space 110, is vertically or horizontally moved by the vertical moving part 400 and the horizontal moving part 500 and the horizontal moving unit 600 which are to be described later, and thereby functions to open/close the moving passage part 120.

Next, the main shaft 300 will be described. As illustrated in FIG. 3 or 4, the main shaft 300 is the component which passes through the shaft insertion hole (not shown) and is coupled to the valve blade 100, and transmits, to the blade 200, the driving force of the vertical moving part 400 and the horizontal moving part 500, and thus enables the vertical or horizontal movement of the blade 200.

Meanwhile, aside from the main shaft 300, a pair of guide shafts 310 and 310' are further coupled to the blade 200, so that the blade 200 uniformly receives the driving force of the vertical moving part 400 and the horizontal moving part 500 when moving vertically or horizontally, and thus, the sealing performance with respect to the moving passage part 120 may be improved.

Meanwhile, in an upper inner portion of the vertical moving part 400, a shaft movement guide block 320 having first through holes (not shown) formed therein through which the main shaft 300 and the guide shafts 310 and 310' pass is provided, so that when the vertical moving part 400 and the horizontal moving part 500 operate, the main shaft 300 and the guide shafts 310 and 310' are prevented from shaking due to a vibration caused by the operation, and thus a precise positional movement of the blade 200 may be achieved.

Next, the vertical moving part 400 will be described. As illustrated in FIG. 2 or 4, the vertical moving part 400 is the component provided under the valve housing 100 and functions as a kind of cylinders which vertically moves the blade 200 and includes a first piston 410, rotating roller parts 420 and 420', and a piston movement restricting block 430.

The first piston 410 is the component coupled to an end of the main shaft 300 and positioned inside the vertical moving part 400 and functions to vertically move the blade 200 by the operation of the cylinder using pneumatic pressure.

The rotating roller parts 420 and 420' are the components, which are respectively inserted into insertion holes 720 and 720' of the main body bracket 700 to be described later on both outer surface of the vertical moving part 400. The rotating roller parts 420 and 420' guides the rotation of the vertical moving part 400 and the horizontal moving part 500 and the horizontal moving unit 600 around the insertion holes 720 and 720' when the horizontal moving part 500 and the horizontal moving unit 600 are operated to horizontally move the blade 200 while the blade 200 has moved upward by the vertical moving part 400, and thus, enables a precise horizontal position movement of the blade 200.

Meanwhile, under the vertical moving part 400, the piston movement restricting block 430 which restricts the movement of the first piston 410 moving down due to the operation of the vertical moving part 400 is favorably provided.

Next, the horizontal moving part 500 will be described. As illustrated in FIG. 2 or 3, the horizontal moving part 500 is a kind of housings, which is coupled under the vertical moving part 400 to guide the operation of the horizontal moving unit 600, and includes vertical movement guide holes 510 and 510'.

The vertical movement guide holes 510 and 510' are the components, which are formed in both side surfaces of the vertical moving part 500 in the vertical direction, and functions to guide the vertical movement of the vertical moving unit 600 using pneumatic pressure inside the horizontal moving part 500 while the horizontal moving unit 600 to be described later is provided inside the horizontal moving part 500, in such a manner that cam rollers 630 and 630' of the horizontal moving unit 600 are inserted and pass through the vertical movement guide holes 510 and 510'.

Next, the horizontal moving unit 600 will be described. As illustrated in FIG. 3 or 4, the horizontal moving unit 600 is the component, which is provided in the horizontal moving part 500 and horizontally moves the blade 200 by the pneumatic pressure generated inside the horizontal moving part 500 using a connection relationship between the opening/closing guide holes 710 and 710' of the main body bracket 700 to be described later, and includes a second piston 610, a movement guide block 620, cam rollers 630 and 630', and fixed shafts 640 and 640'.

The second piston 610 is the component, which is located in an inner lower portion of the horizontal moving part 500 and is vertically moved by the operation of the cylinder using pneumatic pressure, thereby functioning to vertically move the movement guide block 620.

The movement guide block 620 is provided under the second piston 610 and functions to move the cam rollers 630 and 630' according to a vertical movement of the second piston 610.

Meanwhile, the movement guide block 620 is characterized in that guide holes 621 and 621' are vertically formed therein to be symmetrical to each other. The fixed shaft members 640 and 640' to be described later are inserted into the guide holes 621 and 621', and thus, when the horizontal moving unit 600 is vertically moved due to the operation of the horizontal moving part 500, a precise operation of the horizontal moving unit 600 may be achieved.

The cam rollers 630 and 630' are the components, which are rotatably provided respectively on both sides of the movement guide block 620, and pass through the vertical movement guide holes 510 and 510', and are mounted on the opening/closing guide holes 710 and 710', and thus, according to mounting positions of the cam rollers 630 and 630' inside the opening/closing guide holes 710 and 710', the blade 200 may be moved in the opening direction or the closing direction.

The fixed shaft members 640 and 640' are the components, which protrude in a lower inner portion of the horizontal moving part 500 and are inserted into the guide holes 621 and 621', and functions to guide a precise operation of the horizontal moving unit 600.

Figure 5:
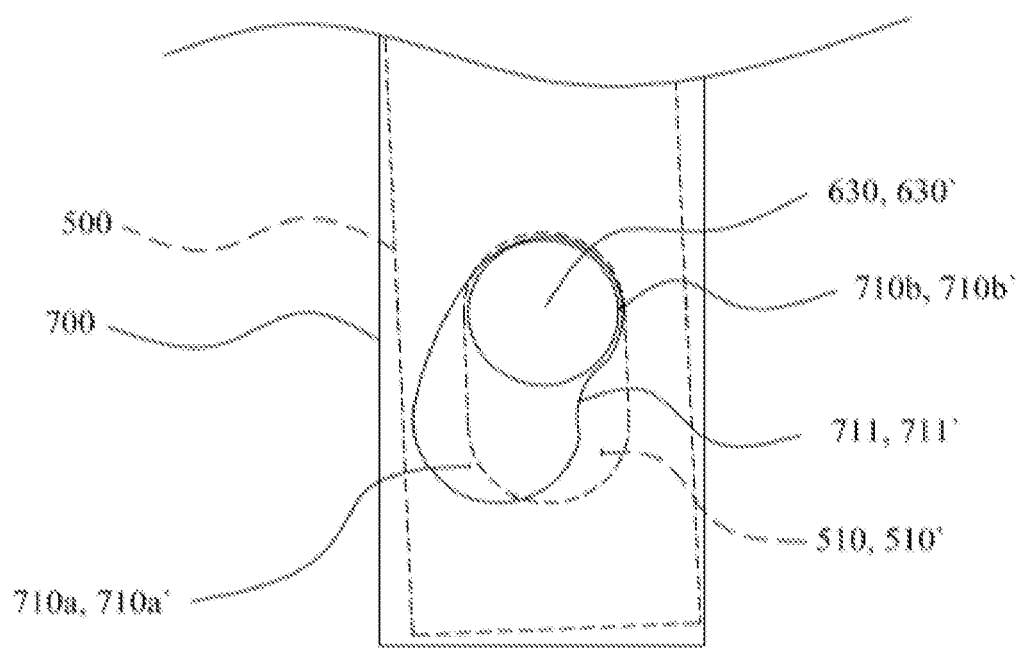
FIG. 5 is a side view illustrating configurations of a vertical movement guide groove and opening/closing guide groove in the configuration of a vacuum valve in accordance with a preferred exemplary embodiment of the present invention.

Next, the main body bracket 700 will be described. As illustrated in FIG. 4 or 5, the main body bracket 700 is the component which is provided under the valve housing 100 to accommodate the vertical moving part 400 and the horizontal moving unit 500, and includes the opening/closing guide holes 710 and 710' and the insertion grooves 720 and 720'.

The opening/closing guide holes 710 and 710' are the components, which are formed in a predetermined opening shape in both inner side surfaces of the main body bracket 700, and in which the cam rollers 630 and 630' having passed through the vertical movement guide holes 510 and 510' are inserted, and enable fore and aft movements of the blade 200 according to a vertical movement of the horizontal moving unit 600.

Meanwhile, the structure of the opening/closing guide holes 710 and 710' is provided such that: first, closing hole intervals 710$b$ and 710$b$' are provided in a lower portion thereof to be recessed toward the rear surface of the valve housing 100, and opening hole intervals 710$a$ and 710$a$' are provided in an upper portion thereof to be recessed toward the front surface of the valve housing 100.

In addition, in border surfaces between the closing hole intervals 710$b$ and 710$b$' and the opening hole intervals 710$a$ and 710$a$', deviation preventing protrusions 711 and 711' are provided to protrude, so that the cam rollers 630 and 630' are prevented from being arbitrarily deviated from the opening hole intervals 710$a$ and 710$a$' while being located in the opening hole intervals 710$a$ and 710$a$'.

The insertion grooves 720 and 720' are provided to be recessed in both inner side surfaces of the main body bracket 700 and connected to the rotating roller parts 420 and 420', and thus enables the pivotal rotations of the vertical moving part 400 and the horizontal moving part 500 depending on whether the horizontal moving part 500 is operated or not.

Hereinafter with reference to FIGS. 5 to 8, a process in which the blade 200 closes the moving passage part 120 will be described in accordance with a preferred exemplary embodiment of the present invention.

First, as illustrated in FIG. 6, in a state in which the moving passage part 120 is initially opened, since the pneumatic pressure inside the vertical moving unit 400 and the horizontal moving unit 500 is low, the first piston 410 comes into a state of being mounted on the piston movement restricting block 430, and accordingly, the blade 200 is positioned at a lower inner portion of the valve housing 100.

In addition, the second piston 610 also comes into a state of contacting the lower portion of the piston movement restricting block 430, and accordingly, the cam rollers 630 and 630' come into a state of being mounted on the opening hole intervals 710$a$ and 710$a$', and thus, the blade 200 is positioned to be horizontally spaced apart from the moving passage part 120.

Subsequently, a process of closing the moving passage part 120 will be described. As, illustrated in FIG. 7, when the pneumatic pressure inside the vertical moving part 400 is raised, the first piston 410 moves upward, and accordingly, the main shaft 300 and the guide shafts 310 and 310' also move upward, and thus moves the blade 200 to an upper inner portion of the valve housing 100.

Figure 8:
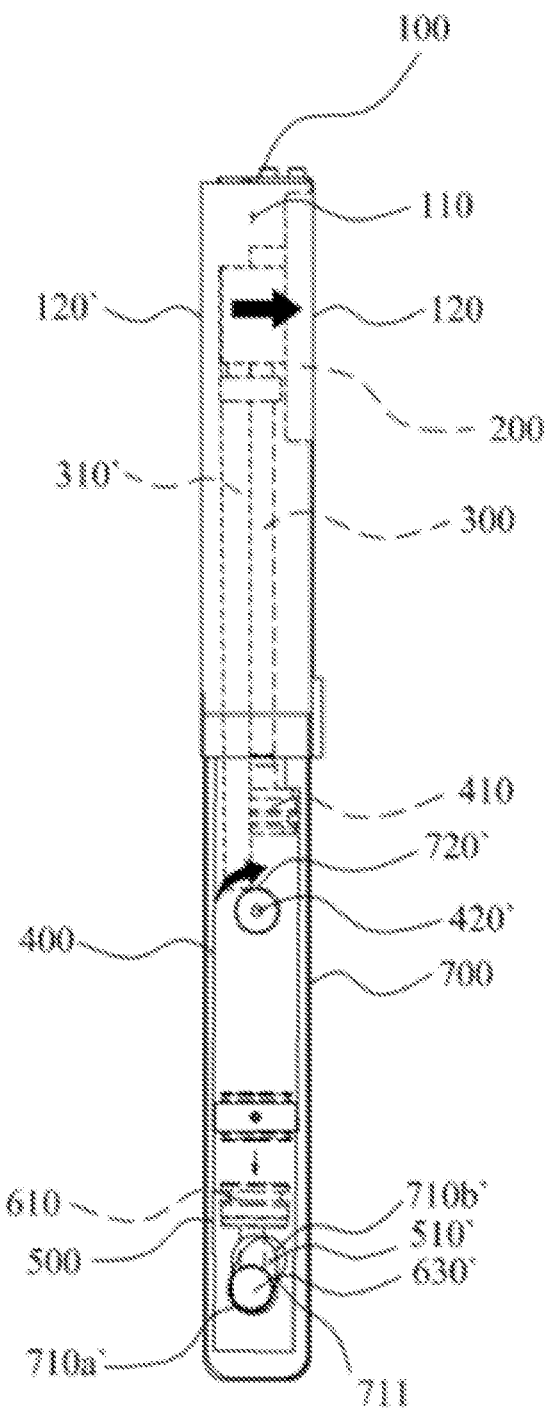
FIG. 8 is an operation state view illustrating a state in which a blade moves forward due to an operation of the horizontal moving part in the configuration of a vacuum valve in accordance with a preferred exemplary embodiment of the present invention.

Next, as illustrated in FIG. 8, when the pneumatic pressure inside the horizontal moving part 500 is raised, the second piston 610 moves downward, and accordingly, the movement guide block 620 moves downward, and thus, the cam rollers 630 and 630' pass through the deviation preventing protrusions 711 and 711' from the opening hole intervals 710$a$ and 710$a$' and move to the closing hole intervals 710$b$ and 710$b$'.

Subsequently, when the cam rollers 630 and 630' are mounted on the closing hole intervals 710$b$ and 710$b$', as illustrated in FIG. 5, due to the structure of the opening/closing guide holes 710 and 710', the vertical moving part 400, the horizontal moving part 500, and the horizontal moving unit 600 rotate clockwise around the insertion grooves 720 and 720' on which the rotating roller parts 420 and 420' are mounted, and thus, the blade 200 closes the moving passage part 120.

Meanwhile, the process of opening the blade 200 is favorably performed in the reverse order to the closing process.

So far, optimal examples have been described in the specification with reference to drawings. Specific terms are used herein, but these terms are merely used to describe the present invention and should not be construed as restricting meanings thereof or the scope of the present invention set forth in claims below. Therefore, those skilled in the art could understand that various modifications and equivalent examples can be made therefrom. Thus, the actual technical scope of the present invention should be determined according to the technical concept of the accompanying claims.

The invention claimed is:

1. A vacuum valve (1) comprising:
a valve housing (100) having a driving space (110) formed therein and moving passage parts (120 and 120') formed to pass through the valve housing (100);
a blade (200) provided in the driving space (110) and opening/closing the moving passage parts (120 and 120') from inside the valve housing (100);
a main shaft (300) coupled to a rear surface of the blade (200);
a vertical moving part (400) which is formed under the valve housing (100), and in which the main shaft (300) and a first piston (410), which moves vertically by pneumatic pressure, are connected to vertically move the blade (200);
a horizontal moving part (500) coupled to a lower portion of the vertical moving part (400) and provided with vertical movement guide grooves (510 and 510') formed vertically in the horizontal moving part (500);
a horizontal moving unit (600) having a second piston (610) provided to an inside (501) of the horizontal moving part (500) and vertically moved by pneumatic pressure, a moving guide block (620) formed under the second piston (610), and cam rollers (630 and 630') formed at a first side and a second side of the moving guide block (620) and passing through the vertical moving guide grooves (510 and 510');

a main body bracket (700) provided under the valve housing (100) so as to accommodate the vertical moving part (400) and the horizontal moving part (500), wherein opening/closing guide holes (710 and 710') are formed in the main body bracket (700) such that the cam rollers (630 and 630'), having passed through the vertical moving guide grooves (510 and 510'), are inserted into the grooves (710 and 710') so as to guide the fore and aft movement of the blade (200) by moving vertically together according to the vertical movement of the horizontal moving unit (600), and wherein the opening/closing guide holes (710 and 710') are obliquely formed in a vertical longitudinal direction of the main body bracket (700).

2. The vacuum valve (1) of claim 1, wherein the opening/closing guide holes (710 and 710') are provided such that:

closing hole intervals (710b and 710b') are provided in a lower portion thereof to be recessed toward a rear surface of the valve housing (100), and opening hole intervals (710a and 710a') are provided in an upper portion thereof to be recessed toward a front surface of the valve housing (100).

3. The vacuum valve (1) of claim 2, wherein border surfaces between the closing hole intervals (710b and 710b') and the opening hole intervals (710a and 710a'), deviation preventing protrusions (711 and 711') are provided to protrude, so that the cam rollers (630 and 630') are prevented from being arbitrarily deviated from the opening hole intervals (710a and 710a') while being located in the opening hole intervals (710a and 710a').

4. The vacuum valve (1) of claim 1, wherein insertion grooves (720 and 720') are provided to be recessed in the main body bracket (700) and rotating roller parts (420 and 420') are respectively provided in the vertical moving part (400) so as to be inserted in the insertion grooves (720 and 720') and to enable pivotal rotation of the vertical moving part (400) around the insertion grooves (720 and 720').

5. The vacuum valve (1) of claim 1, wherein:

guide shafts (310 and 310') which guide a vertical movement of the blade (200) are formed on the rear surface of the blade (200) to be symmetrical to each other; guide grooves (621 and 621') are vertically formed to be symmetrical to each other in the movement guide block (620); and fixed shaft members (640 and 640') which are respectively inserted into the guide grooves (621 and 621') to guide a vertical movement of the horizontal moving unit (600) are provided to protrude in a lower inner portion of the horizontal moving part (500).

* * * * *